United States Patent [19]

Ganger et al.

[11] Patent Number: 5,359,294
[45] Date of Patent: Oct. 25, 1994

[54] CHARGE-BALANCED SWITCHED-CAPACITOR CIRCUIT AND AMPLIFIER CIRCUIT USING SAME

[75] Inventors: Jeffrey D. Ganger; Kelvin E. McCollough; Jules D. Campbell, Jr, all of Austin, Tex.

[73] Assignee: Motorola, Inc., Schaumburg, Ill.

[21] Appl. No.: 132,004

[22] Filed: Oct. 5, 1993

[51] Int. Cl.$^5$ .............................. H03F 3/45
[52] U.S. Cl. ........................ 330/258; 330/9; 330/302; 307/352; 307/353; 320/1; 363/62
[58] Field of Search ............ 330/258, 9, 302, 303, 330/304, 51; 307/352, 353, 355; 320/1; 363/60, 62

[56] References Cited

U.S. PATENT DOCUMENTS

| 4,697,152 | 9/1987 | Westwick | 330/9 |
| 5,049,831 | 9/1991 | Westwick | 330/107 |
| 5,237,209 | 8/1993 | Brewer | 363/60 |

FOREIGN PATENT DOCUMENTS

| 59-116997 | 12/1982 | Japan | G11C 27/2 |
| 61-194700 | 2/1985 | Japan | G11C 27/2 |

OTHER PUBLICATIONS

Senderowicz, et al., "A Family of Differential NMOS Analog Cir. for a PCM Codec Filter Chip", IEEE Jour. of Solid–State Circuit; vol. SC–17, No. 6, pp. 1014–1023 (1982).

K. R. Laker; "Equi. Circuits for the Analy. and Synthesis of Switched Capacitor Netwrk. "; The Bell Sys. Tech. Journal, vol. 58, No. 3, pp. 729–769 (1979).

*Primary Examiner*—James B. Mullins
*Assistant Examiner*—Jim Dudek
*Attorney, Agent, or Firm*—Paul J. Polansky

[57] ABSTRACT

A charge-balanced switched-capacitor circuit (50, 61) includes two capacitors (53, 54/72, 73) which are equalized by being connected in parallel during a first time period. This equalization cancels any mismatch in either capacitor (53, 54/72, 73) which would tend to affect an associated common-mode voltage. During a second time period, the two capacitors (53, 54/72, 73) are connected in series between two signal lines (42, 43). In one embodiment, the switched-capacitor circuit (50) forms a common-mode feedback sensing circuit by providing a common-mode feedback voltage to a fully-differential amplifier (41) at a common interconnection point of the two capacitors (53, 54). This embodiment draws no DC current, and thus prevents harmonic distortion of an output signal on the two signal lines when using a slew-rate limited amplifier (41). In another embodiment, the switched-capacitor circuit (61) functions as an input sampler at an input of a switched-capacitor amplifier circuit (60).

20 Claims, 2 Drawing Sheets 5,359,294

CHARGE-BALANCED SWITCHED-CAPACITOR CIRCUIT AND AMPLIFIER CIRCUIT USING SAME

FIELD OF THE INVENTION

This invention relates generally to electrical circuits, and more particularly, to switched-capacitor circuits.

BACKGROUND OF THE INVENTION

Many analog circuits, such as integrators, active filters, and the like, use differential signalling. Unlike single-ended signalling in which a voltage varies with respect to a fixed voltage, such as a ground voltage, differential signalling conveys a signal as a difference between two voltages. A differential signal includes two components, a differential component and a common-mode component. While the differential component conveys the analog signal, the common-mode component is also important. The common-mode voltage of a differential signal determines the available headroom for subsequent amplifiers and filters. In general, it is desirable to have the common-mode voltage set at the midpoint between positive and negative power supply voltages. If the common-mode voltage varies too much from the supply midpoint, operating headroom is reduced, which may cause distortion when a subsequent amplifier processes the differential signal.

Switched-capacitors are generally equivalent to resistors, and are more easily manufactured in integrated circuit form. Thus, switched-capacitor circuits are often useful in differential signal processing circuits. A switched-capacitor circuit used as an input sampler samples an input signal during a sample phase and transfers the input signal to the input terminals of a fully-differential amplifier during a transfer phase. A fully-differential switched-capacitor input sampler may be adapted to sample a single-ended signal by connecting one of the inputs to an analog ground terminal. However, known switched-capacitor input samplers have no mechanism to guarantee the equality of charge on corresponding capacitors in the input sampler. If equality is not maintained, then one of the amplifier's outputs may eventually become displaced more than the other relative to the common mode, which tends to shift the output common-mode voltage.

Another use of switched-capacitor circuits is in common-mode feedback circuits. One way to sense the common-mode voltage between a differential signal is to use resistor averaging, as taught by Paul M. Henry in U.S. Pat. No. 4,105,942. Two equal-valued resistors are connected in series between an amplifier's positive and negative output terminals. The interconnection point between the resistors averages the two voltages, and thus represents the sensed common-mode voltage. This voltage is fed back to the amplifier, which adjusts the common-mode output voltage until it equals a reference voltage. However, the use of resistors is generally not desirable considering available integrated circuit technology. In order to have resistance values large enough to have low current drain, excessive integrated circuit area would be required.

It is possible to sense the common-mode voltage using two capacitors connected in series between the differential signal lines. However, the use of capacitors to sense the common-mode voltage creates an additional problem: any initial offset will remain on the capacitors, offsetting the common-mode voltage from the reference voltage. Including high-valued resistors in parallel with the capacitors to discharge the initial offset is not very helpful either, because these resistors would require a large amount of integrated circuit area.

One alternative known in the prior art is to substitute switched-capacitors for resistors to periodically discharge the continuous-time sampler. While avoiding the need for a large circuit area, however, switched-capacitors still consume significant amounts of current when they repeatedly discharge the fixed capacitors. In addition, switched-capacitors cause large instantaneous current transients on the output signal lines, which may result in undesirable harmonic distortion on the output signal if the amplifier is not strong enough to avoid going into a current-limit condition. What is needed, then, is a switched-capacitor circuit which overcomes the problems with switched-capacitor networks when used as input samplers, common-mode feedback circuits, and the like.

SUMMARY OF THE INVENTION

Accordingly, the present invention provides, in one form, a charge-balanced switched-capacitor circuit including first and second capacitors, an equalization portion, and a coupling portion. Each of the first and second capacitors has first and second terminals. The equalization portion couples the first terminal of the first capacitor to the first terminal of the second capacitor, and the second terminal of the first capacitor to the second terminal of the second capacitor, during a first time period. The coupling portion couples the first terminal of the first capacitor to a first signal line, the second terminal of the second capacitor to a second signal line, and the second terminal of the first capacitor to the first terminal of the second capacitor, during a second time period. The coupling portion includes first and second switching elements. The first switching element has a first terminal coupled to the second terminal of the first capacitor, and a second terminal for providing a common-mode output terminal of the switched-capacitor circuit. The first switching element is active in response to a first control signal. The second switching element has a first terminal coupled to the common-mode output terminal, and a second terminal coupled to the first terminal of the second capacitor. The second switching element is active in response to the first control signal.

In another form, the present invention provides an amplifier circuit with a charge-balanced switched-capacitor circuit, including a differential amplifier, first and second capacitors, an equalization portion, and a common-mode sensing portion. The differential amplifier has a positive input terminal for receiving a first input voltage, a negative input terminal for receiving a second input voltage, a positive output terminal coupled to a first signal line, a negative output terminal coupled to a second signal line, and a common-mode feedback input terminal coupled to a common-mode feedback signal line. The first and second capacitors each have first and second terminals. The equalization portion couples the first terminal of the first capacitor to the first terminal of the second capacitor, and the second terminal of the first capacitor to the second terminal of the second capacitor, during a first time period. The common-mode sensing portion is coupled to the first and second signal lines, and couples the first terminal of the first capacitor to the first signal line, the second terminal of the second capacitor to the second signal line, and both the second terminal of the first capacitor and the first terminal of the second capacitor to the common-mode feedback signal line, during a second time period.

These and other features and advantages will be more clearly understood from the following detailed description taken in conjunction with the accompanying drawings.

DETAILED DESCRIPTION OF A PREFERRED EMBODIMENT

Figure 1:
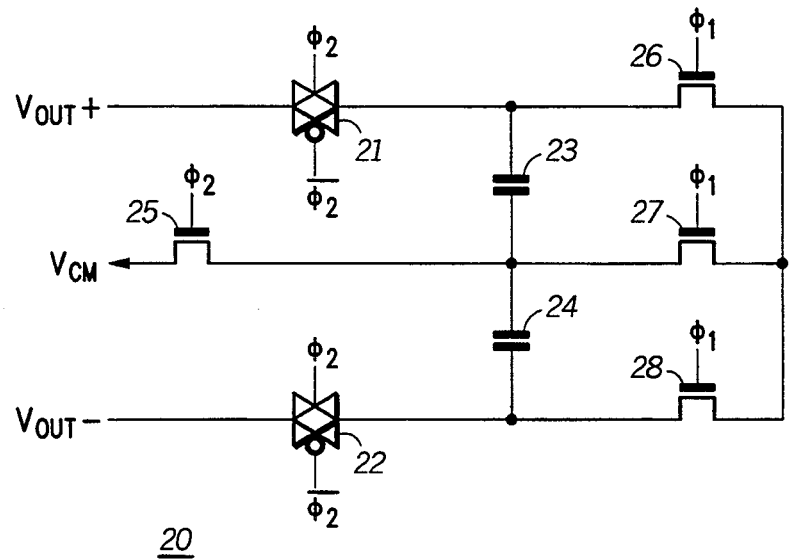
FIG. 1 illustrates in partial schematic and partial logic diagram form a switched-capacitor circuit known in the prior art.

FIG. 1 illustrates in partial schematic and partial logic diagram form a switched-capacitor circuit 20 known in the prior art. Switched-capacitor circuit 20 includes transmission gates 21 and 22, capacitors 23 and 24, and N-channel metal-oxide-semiconductor (MOS) transistors 25–28. Transmission gates 21 and 22 have first terminals for receiving a differential voltage represented by input signals labelled "$V_{OUT+}$" and "$V_{OUT-}$", respectively, and are both made conductive by the activation of signals labelled "$\Phi 2$" and "$\Phi 2$". Capacitor 23 has a first terminal connected to a second terminal of transmission gate 21, and a second terminal. Capacitor 24 has a first terminal connected to the second terminal of capacitor 23, and a second terminal connected to a second terminal of transmission gate 22. Transistor 25 has a first source/drain terminal connected to the second terminal of capacitor 23, a second source/drain terminal for providing a sensed common-mode voltage labelled "$V_{CM}$", and a gate for receiving signal $\Phi 2$. Transistor 26 has a first source/drain terminal connected to the first terminal of capacitor 23, a second source/drain terminal, and a gate for receiving a signal labelled "$\Phi 1$". Transistor 27 has a first source/drain terminal connected to the second terminal of capacitor 23, a second source/drain terminal connected to the second source/drain terminal of transistor 26, and a gate for receiving signal $\Phi 1$. Transistor 28 has a first source/drain terminal connected to the second terminal of capacitor 24, a second source/drain terminal connected to the second source/drain terminals of transistors 26 and 27, and a gate for receiving signal $\Phi 1$. Note that the designation of source and drain terminals for various transistors described herein is arbitrary will vary according to the voltages applied, and thus these terminals will be described generically as "source/drain" terminals.

Signals $\Phi 1$ and $\Phi 2$ are non-overlapping clock signals which define two phases of operation of switched-capacitor circuit 50. During $\Phi 1$ (signal $\Phi 1$ active), the terminals of capacitors 23 and 24 are connected together to discharge them. Transmission gates 21 and 22 and transistor 25 are all inactive. During $\Phi 2$ (signal $\Phi 2$ active), transistors 26–28 are nonconductive and transmission gates 21 and 22 and transistor 25 are all conductive. During $\Phi 2$, capacitors 23 and 24 discharge an offset associated with a continuous-time capacitor divider (not shown).

Switched-capacitor circuit 20 avoids the problems associated with the resistor divider technique. Specifically, switched-capacitor circuit 20 has a relatively-small integrated circuit area due to the use of capacitors and switching elements. Circuit 20 is also highly accurate, since integrated circuit manufacturing techniques can fairly accurately match capacitance values. Circuit 20 also causes only a small direct-current (DC) load on $V_{OUT+}$ and $V_{OUT-}$ because capacitors 23 and 24 may be given small capacitances. Thus, circuit 20 may be used with an operational transconductance amplifier (OTA), that is, an amplifier which receives an input voltage and provides an output current in response, the output current providing a resulting output voltage when driven through a load (not shown).

While avoiding the need for a large circuit area, however, switched-capacitor circuit 20 still consumes substantial DC current, that is, current required during $\Phi 2$ to recharge capacitors 23 and 24 even when $V_{OUT+}$ and $V_{OUT-}$ remain substantially constant. During $\Phi 1$, transistors 26–28 connect the terminals of capacitors 23 and 24 to the common-mode voltage between $V_{OUT+}$ and $V_{OUT-}$. Note that the second source/drain terminals of transistors 26–28 may also be connected to a voltage representative of the desired common-mode voltage. In addition, this recharging causes large instantaneous current transients on the $V_{OUT+}$ and $V_{OUT-}$ signal lines, which may cause undesirable harmonic distortion if switched-capacitor circuit 20 is used with a current-limited amplifier.

Figure 2:
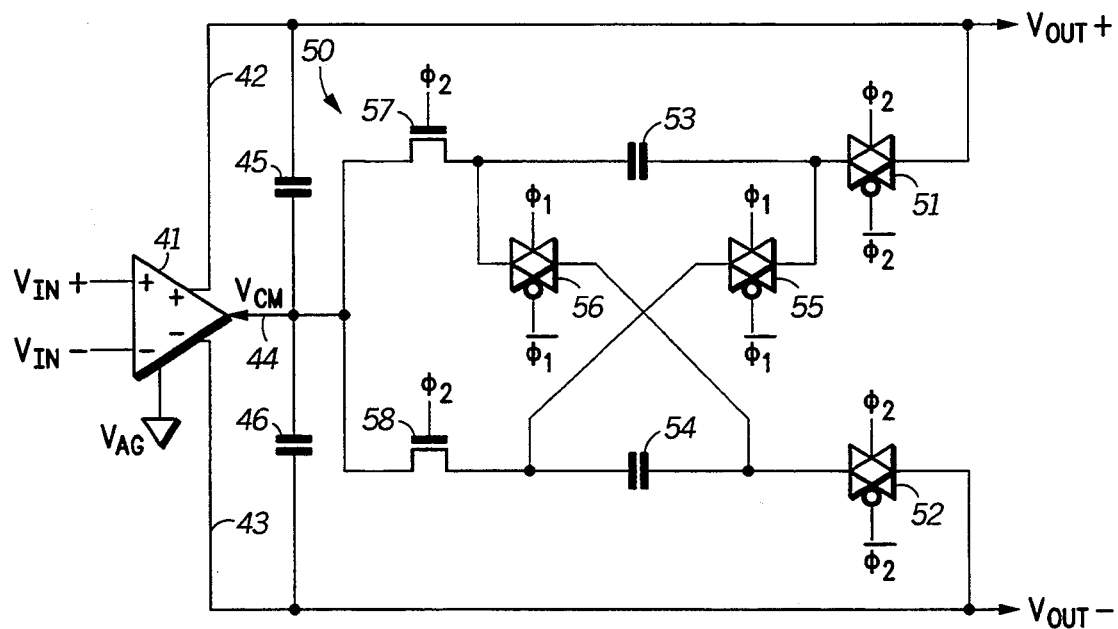
FIG. 2 illustrates in partial schematic and partial logic diagram form an amplifier circuit using a charge-balanced switched-capacitor circuit according to a first embodiment of the present invention.

FIG. 2 illustrates in partial schematic and partial logic diagram form an amplifier circuit 40 using a charge-balanced switched-capacitor circuit 50 according to a first embodiment of the present invention. Amplifier 40 includes generally a fully-differential operational amplifier 41, a first output signal line 42 for conducting signal $V_{OUT+}$, a second output signal line 43 for conducting signal $V_{OUT-}$, a common-mode feedback signal line 44 for conducting signal $V_{CM}$, capacitors 45 and 46, and switched-capacitor circuit 50. Amplifier 41 has a positive input terminal for receiving a signal labelled "$V_{IN+}$", a negative input terminal for receiving a signal labelled "$V_{IN-}$", a positive output terminal connected to signal line 42 for providing signal $V_{OUT+}$, a negative output terminal connected to signal line 43 for providing signal $V_{OUT-}$, a common-mode feedback terminal connected to signal line 44 for receiving signal $V_{CM}$, and a reference voltage input terminal connected to a power supply voltage terminal labelled "$V_{AG}$". $V_{AG}$ is an analog ground voltage terminal providing a voltage which is approximately at the midpoint between positive and negative voltage supplies. For example, in a five-volt system, $V_{AG}$ would have a value of approximately 2.5 volts. Capacitor 45 has a first terminal connected to signal line 42, and a second terminal connected to signal line 44. Capacitor 46 has a first terminal connected to signal line 44, and a second terminal connected to signal line 43.

Switched-capacitor circuit 50 is connected between signal lines 42 and 43, and provides sensed common-mode voltage $V_{CM}$ to signal line 44, and includes transmission gates 51 and 52, capacitors 53 and 54, transmission gates 55 and 56, and N-channel transistors 57 and 58. Transmission gate 51 has a first terminal connected to signal line 42, a second terminal, a true control terminal for receiving signal Φ2, and a complementary control terminal for receiving signal $\overline{\Phi 2}$. Transmission gate 52 has a first terminal, a second terminal connected to signal line 43, a true control terminal for receiving signal Φ2, and a complementary control terminal for receiving signal $\overline{\Phi 2}$. Capacitor 53 has a first terminal connected to the second terminal of transmission gate 51, and a second terminal. Capacitor 54 has a first terminal, and a second terminal connected to the first terminal of transmission gate 52. Transmission gate 55 has a first terminal connected to the first terminal of capacitor 53, a second terminal connected to the first terminal of capacitor 54, a true control terminal for receiving signal Φ1, and a complementary control terminal for receiving signal $\overline{\Phi 1}$. Transmission gate 56 has a first terminal connected to the second terminal of capacitor 53, a second terminal connected to the second terminal of capacitor 54, a true control terminal for receiving signal Φ1, and a complementary control terminal for receiving signal $\overline{\Phi 1}$. Transistor 57 has a first source/drain terminal connected to the second terminal of capacitor 53, a second source/drain terminal connected to signal line 44, and a gate for receiving signal Φ2. Transistor 58 has a first source/drain terminal connected to signal line 44, a second source/drain terminal connected to the first terminal of capacitor 54, and a gate for receiving signal Φ2.

Generally, switched-capacitor circuit 50 is a charge-balanced circuit which may be used to overcome problems with known switched-capacitor circuits used as common-mode feedback circuits, input samplers, and the like. During a first time period (Φ1), switched-capacitor circuit 50 is in an equalization phase, and transmission gates 51 and 52 and transistors 57 and 58 are inactive. Transmission gates 55 and 56 are active to connect capacitors 53 and 54 together in parallel and balance the charge between the two. During a second time period (Φ2), switched-capacitor circuit 50 is in a sample phase, and transmission gates 51 and 52 and transistors 57 and 58 are all active. Transmission gates 55 and 56 are inactive during this time. Capacitors 53 and 54 are connected in series between signal lines 42 and 43.

When used as a common-mode feedback circuit, switched-capacitor circuit 50 senses the common-mode voltage between signals $V_{OUT+}$ and $V_{OUT-}$ provides this voltage to signal line 44 as signal $V_{CM}$ during Φ2. During Φ2, capacitors 53 and 54 discharge any initial offset in fixed capacitors 45 and 46. Switched-capacitor circuit 50 retains all the benefits of circuit 20 of FIG. 1 over resistor averagers, but in addition has two added benefits. First, unlike switched-capacitor circuit 20, switched capacitor circuit 50 draws no common-mode current. Second, since switched-capacitor circuit 50 draws no common-mode current, amplifier 41 never goes into a current-limit condition, thus reducing or eliminating the harmonic distortion which would be caused if switched-capacitor circuit 20 were used.

In the illustrated embodiment, amplifier 41 is a current-limited OTA. Transmission gates 51, 52, 55, and 56 are complementary metal-oxide semiconductor (CMOS) transmission gates. It should be apparent, however, that transmission gates 51, 52, 55, and 56, and transistors 57 and 58 function as switching elements and many different circuit elements may be substituted therefor. For example, transistors 57 and 58 may be replaced by CMOS transmission gates. Also, switched-capacitor circuit 50 may be used in different switched-capacitor applications besides common-mode feedback circuits.

Figure 3:
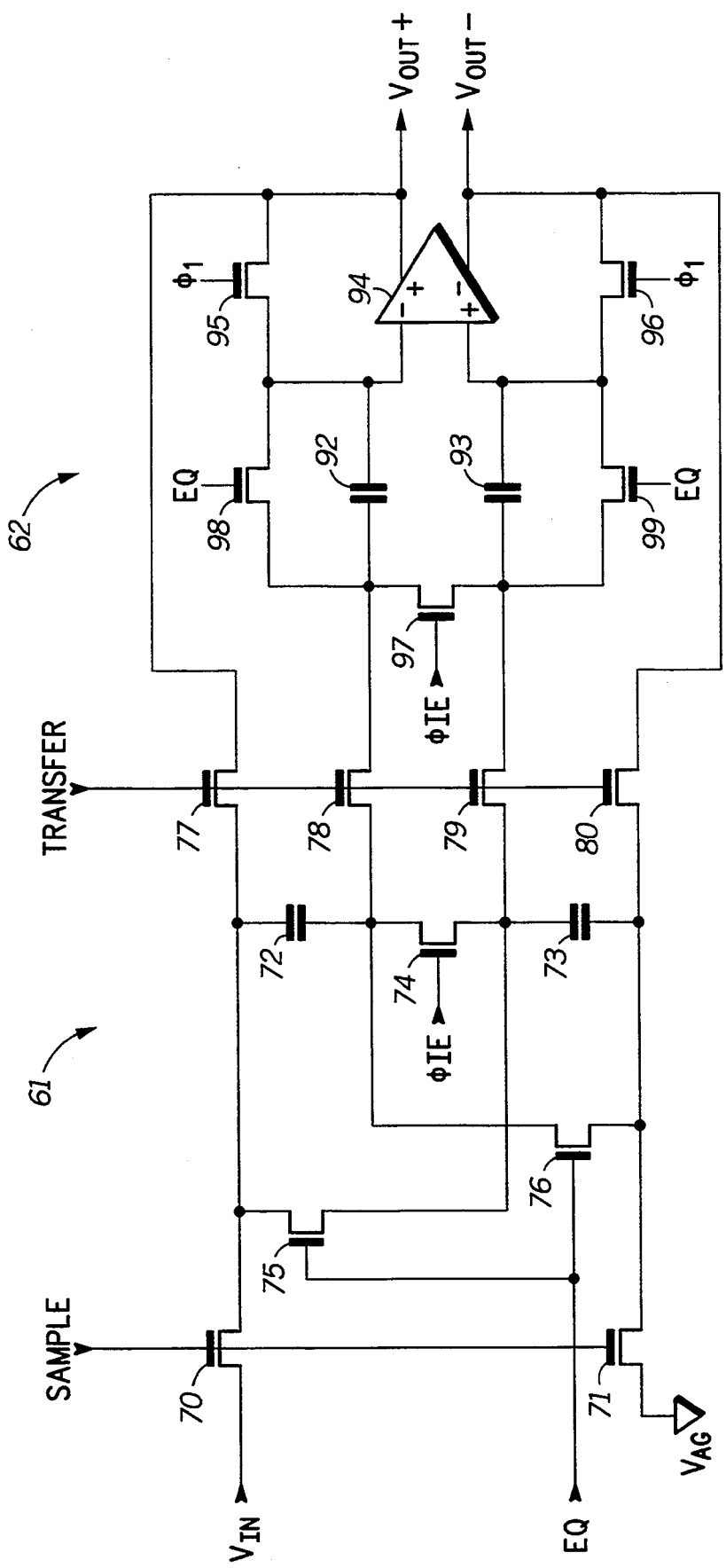
FIG. 3 illustrates in partial schematic and partial logic diagram form an amplifier circuit using a charge-balanced switched-capacitor circuit according to a second embodiment of the present invention.

One such application is as an input sampler, such as in FIG. 3, which illustrates in partial schematic and partial logic diagram form an amplifier circuit 60 using a charge-balanced switched-capacitor circuit 61 according to a second embodiment of the present invention. Amplifier circuit 60 includes generally switched-capacitor circuit 61 and an amplifier 62. Switched-capacitor circuit 61 includes N-channel transistors 70 and 71, capacitors 72 and 73, and N-channel transistors 74–80. Transistor 70 has a first source/drain terminal for receiving an input signal labelled "$V_{IN}$", a second source/drain terminal, and a gate for receiving a control signal labelled "SAMPLE". Transistor 71 has a first source/drain terminal, a second source/drain terminal connected to $V_{AG}$, and a gate for receiving signal SAMPLE. Capacitor 72 has a first terminal connected to the second source/drain terminal of transistor 70, and a second terminal. Capacitor 73 has a first terminal, and a second terminal connected to the first source/drain terminal of transistor 71. Transistor 74 has a first source/drain terminal connected to the second terminal of capacitor 72, a second source/drain terminal connected to the first terminal of capacitor 73, and a gate for receiving a control signal labelled "ΦIE". Transistor 75 has a first source/drain terminal connected to the first terminal of capacitor 72, a second source/drain terminal connected to the first terminal of capacitor 73, and a gate for receiving a control signal labelled "EQ". Transistor 76 has a first source/drain terminal connected to the second terminal of capacitor 72, a second source/drain terminal connected to the second terminal of capacitor 73, and a gate for receiving signal EQ. Transistor 77 has a first source/drain terminal connected to the first terminal of capacitor 72, a second source/drain terminal, and a gate for receiving a control signal labelled "TRANSFER". Transistor 78 has a first source/drain terminal connected to the second terminal of capacitor 72, a second source/drain terminal, and a gate for receiving signal TRANSFER. Transistor 79 has a first source/drain terminal connected to the first terminal of capacitor 73, a second source/drain terminal, and a gate for receiving signal TRANSFER. Transistor 80 has a first source/drain terminal connected to the second terminal of capacitor 73, a second source/drain terminal, and a gate for receiving signal TRANSFER.

Amplifier circuit 62 includes capacitors 92 and 93, a fully-differential amplifier 94, and N-channel transistors 95–99. Capacitor 92 has a first terminal connected to the second source/drain terminal of transistor 78, and a second terminal. Capacitor 93 has a first terminal connected to the second source/drain terminal of transistor 79, and a second terminal. Amplifier 94 has a negative input terminal connected to the second terminal of capacitor 92, a positive input terminal connected to the second terminal of capacitor 93, a positive output terminal connected to the second source/drain terminal of transistor 77 for providing signal $V_{OUT+}$, and a negative output terminal connected to the second source/drain terminal of transistor 80 for providing signal $V_{OUT-}$. Transistor 95 has a first source/drain terminal connected to the positive output terminal of amplifier 94, a second source/drain terminal connected to the negative input terminal of amplifier 94, and a gate for receiving signal Φ1. Transistor 96 has a first source/drain terminal connected to the negative output terminal of amplifier 94, a second source/drain terminal connected to the positive input terminal of amplifier 94, and a gate for receiving signal $\Phi 1$. Transistor 97 has a first source/drain terminal connected to the second source/drain terminal of transistor 78, a second source/drain terminal connected to the second source/drain terminal of transistor 79, and a gate for receiving signal $\Phi IE$. Transistor 98 has a first source/drain terminal connected to the second source/drain terminal of transistor 78, a second source/drain terminal connected to the negative input terminal of amplifier 94, and a gate for receiving signal EQ. Transistor 99 has a first source/drain terminal connected to the second source/drain terminal of transistor 79, a second source/drain terminal connected to the positive input terminal of amplifier 94, and a gate for receiving signal EQ.

Switched-capacitor circuit 61 has three phases of operation: an equalization phase in which signal EQ is active, a sample phase in which signals SAMPLE and $\Phi IE$ are active, and a transfer phase in which signal TRANSFER is active. During the equalization phase, signal EQ is active, and signals SAMPLE, $\Phi IE$, and TRANSFER are inactive. Transistors 75 and 76 are conductive, connecting capacitors 72 and 73 together in parallel. Any charge that exists on either one or both of capacitors 72 and 73 is thus shared, cancelling out any offset which would affect the common-mode voltage of the differential signal as it is conveyed through amplifier circuit 60 and subsequent amplifier stages. In the illustrated embodiment, signal $V_{IN}$ is a single-ended signal which is referenced to $V_{AG}$. In FIG. 3, $V_{AG}$ represents the lowest circuit potential, or zero volts. In addition, the common mode voltage of the amplifier is approximately mid supply. However switched-capacitor circuit 61 could receive a fully-differential input signal as well. Note also that in other embodiments, a mid-supply voltage could also be used for $V_{AG}$.

During the sample phase, signals SAMPLE and $\Phi IE$ are active, and signals EQ and TRANSFER are inactive. Transistors 70, 71, and 74 are conductive, charging the first terminal of capacitor 72 to $V_{IN}$, the second terminal of capacitor 73 to $V_{AG}$, and coupling the second terminal of capacitor 72 to the first terminal of capacitor 73 via conductive transistor 74.

During the transfer phase, signal TRANSFER is active, and signals EQ, SAMPLE, and $\Phi IE$ are inactive. Transistors 77-80 are conductive to transfer the sampled charges to respective nodes in amplifier circuit 62.

Amplifier circuit 62 forms a direct-transfer switched-capacitor amplifier stage. In other embodiments, however, amplifier circuit 62 may be replaced by a switched-capacitor integrator or the like. Capacitors 92 and 93 are included to cancel the offset in amplifier 94. Like switched-capacitor circuit 61, amplifier circuit 62 also operates during three phases of operation. During the equalization phase, transistors 98 and 99 are conductive, discharging sampling capacitors 92 and 93, respectively. During the sampling phase, when signal $\Phi IE$ is active, transistor 97 is conductive and connects the first terminals of capacitors 92 and 93 together. This connection divides an offset voltage, designated "$V_{OS}$" associated with amplifier 94 equally across capacitors 92 and 93 so that each capacitor has a voltage of $V_{OS}/2$ across it. During both the equalization and sampling phases, signal $\Phi 1$ is active, and connects amplifier 94 in a unity-gain inverting configuration. During the transfer phase, signal $\Phi 1$ $\Phi IE$ become inactive, signal TRANSFER becomes active, and amplifier circuit 62 transfers the input voltage sampled on capacitors 72 and 73 to amplifier circuit 62. Capacitors 92 and 93 ensure that the differential voltage represented by signals $V_{OUT+}$ and $V_{OUT-}$ is equal to $(V_{IN}/2+V_{OS}/2+V_{IN}/2-V_{OS}/2)$, which is equal to $V_{IN}$.

Switched-capacitor circuit 61 is charge-balanced to guarantee the long-term equality of charge between capacitors 72 and 73. During the equalization phase, capacitors 72 and 73 are connected together in parallel, evenly balancing the charge between the two. During the sample phase, capacitors 72 and 73 charge according to applied voltages $V_{IN}$ and $V_{AG}$. Note that in the illustrated embodiment, transistor 74 is made conductive by a different signal ($\Phi IE$) than transistors 70 and 71 are (signal SAMPLE), allowing independent control during the sample phase. Also, switched capacitor circuit 61 used a switching element formed by a single transistor 74 only since amplifier circuit 60 requires no common-mode sensing. Finally, an additional transfer phase, which occurs after the end of the equalization and sample phases, causes a transfer of voltages at the terminals of capacitors 72 and 73.

Note that the timings associated with amplifier circuit 60 are given by way of example and may be altered in other embodiments and when used with different subsequent amplifier stages. Note also that transistors 70-71, 74-80, and 95-99 may be replaced with other types of switching elements in other embodiments, such as transmission gates, P-channel transistors, etc.

While the invention has been described in the context of a preferred embodiment, it will be apparent to those skilled in the art that the present invention may be modified in numerous ways and may assume many embodiments other than that specifically set out and described above. For example, many different types of switching elements including transmission gates, any type of transistor switch, and other switching elements are contemplated. An input sampler according to the present invention may also be used to receive a fully-differential voltage as well as a single-ended voltage referenced to a reference voltage. Accordingly, it is intended by the appended claims to cover all modifications of the invention which fall within the true spirit and scope of the invention.

We claim:

1. A charge-balanced switched-capacitor circuit comprising:

first and second capacitors each having first and second terminals;

equalization means for coupling said first terminal of said first capacitor to said first terminal of said second capacitor, and said second terminal of said first capacitor to said second terminal of said second capacitor, during a first time period;

coupling means for coupling said first terminal of said first capacitor to a first signal line, said second terminal of said second capacitor to a second signal line, and said second terminal of said first capacitor to said first terminal of said second capacitor, during a second time period, said coupling means comprising first and second switching elements;

said first switching element having a first terminal coupled to said second terminal of said first capacitor, and a second terminal for providing a common-mode output terminal of the switched-capacitor circuit, said first switching element active in response to a first control signal; and said second switching element having a first terminal coupled to said common-mode output terminal, and a second terminal coupled to first terminal of said second capacitor, said second switching element active in response to said first control signal.

2. The switched-capacitor circuit of claim 1 wherein said equalization means comprises:
   a third switching element having a first terminal coupled to said first terminal of said first capacitor, and a second terminal coupled to said first terminal of said second capacitor, said third switching element active in response to a second control signal; and
   a fourth switching element having a first terminal coupled to said second terminal of said first capacitor, and a second terminal coupled to said second terminal of said second capacitor, said fourth switching element active in response to said second control signal.

3. The switched-capacitor circuit of claim 4 wherein said coupling means further comprises:
   a fifth switching element having a first terminal coupled to said first signal line and a second terminal coupled to said first terminal of said first capacitor, said fifth switching element active during said first time period; and
   a sixth switching element having a first terminal coupled to said second terminal of said second capacitor, and a second terminal coupled to said second signal line, said sixth switching element active during said first time period.

4. The switched-capacitor circuit of claim 1 wherein said first signal line conducts an input voltage thereon, and wherein said second signal line conducts a reference voltage thereon.

5. A charge-balanced switched-capacitor circuit comprising:
   first and second capacitors each having first and second terminals;
   a first switching element having a first terminal connected to said first terminal of said first capacitor, and a second terminal coupled to said first terminal of said second capacitor, said first switching element active during a first time period;
   a second switching element having a first terminal coupled to said second terminal of said first capacitor, and a second terminal coupled to said second terminal of said second capacitor, said second switching element active during said first time period.
   a third switching element having a first terminal coupled to a first signal terminal, and a second terminal coupled to said first terminal of said first capacitor, said third switching element active during a second time period;
   a fourth switching element having a first terminal coupled to said second terminal of said second capacitor, and a second terminal coupled to a second signal terminal, said fourth switching element active during said second time period; and
   a fifth switching element having a first terminal coupled to a said second terminal of said first capacitor, and a second terminal coupled to said first terminal of said second capacitor, said fifth switching element active during said second time period.

6. The switched-capacitor circuit of claim 7 wherein said first and second time periods correspond to active times of first and second non-overlapping clock signals.

7. The switched-capacitor circuit of claim 7 wherein said third switching element comprises common-mode sensing means for providing a common-mode feedback signal representative of a common mode voltage between said first and second signal lines to a common-mode feedback signal line during said second time period.

8. The switched-capacitor circuit of claim 5 further comprising:
   a sixth switching element having a first terminal coupled to said first terminal of said first capacitor, and a second terminal for providing a first sampled signal, said sixth switching element active during a third time period; and
   a seventh switching element having a first terminal connected to said second terminal of said second capacitor, and a second terminal for providing a second sampled signal, said seventh switching element active during said third time period.

9. The switched-capacitor circuit of claim 8 further comprising:
   an eighth switching element having a first terminal coupled to said second terminal of said first capacitor, and a second terminal for providing, a third sampled signal, said eighth switching element active during said third time period; and a ninth switching element having a first terminal coupled to said first terminal of said second capacitor, and a second terminal for providing a fourth sampled signal, said ninth switching element active during said third time period.

10. An amplifier circuit with a charge-balanced switched-capacitor circuit, comprising:
    a differential amplifier having a positive input terminal for receiving a first input voltage, a negative input terminal for receiving a second input voltage, a positive output terminal coupled to a first signal line, a negative output terminal coupled to a second signal line, and a common-mode feedback input terminal coupled to a common-mode feedback signal line;
    first and second capacitors each having first and second terminals;
    equalization means for coupling said first terminal of said first capacitor to said first terminal of said second capacitor, and said second terminal of said first capacitor to said second terminal of said second capacitor, during a first time period; and
    common-mode sensing means coupled to said first and second signal lines, for coupling said first terminal of said first capacitor to said first signal line, said second terminal of said second capacitor to said second signal line, and both said second terminal of said first capacitor and said first terminal of said second capacitor to said common-mode feedback signal line, during a second time period.

11. The amplifier circuit of claim 12 wherein said equalization means comprises:
    a first switching element having a first terminal coupled to said first terminal of said first capacitor and a second terminal coupled to said first terminal of said second capacitor, said first switching element active in response to a first clock signal; and
    a second switching element having a first terminal coupled to said second terminal of said first capacitor and a second terminal coupled to said second terminal of said second capacitor, said second switching element active in response to said first clock signal.

12. The amplifier circuit of claim 10 wherein said common-mode sensing means comprises:
   a third switching element having a first terminal coupled to said first signal line, and a second terminal coupled to said first terminal of said first capacitor, said third switching element active in response to a second clock signal;
   a fourth switching element having a first terminal coupled to said first terminal of said second capacitor, and a second terminal coupled to said second signal line, said fourth switching element active in response to said second clock signal;
   a fifth switching element having a first terminal coupled to said second terminal of said first capacitor, and a second terminal coupled to said common-mode feedback signal line, said fifth switching element active in response to said second clock signal; and
   a sixth switching element having a first terminal coupled to said second terminal of said second capacitor, and a second terminal coupled to said common-mode feedback signal line, said sixth switching element active in response to said second clock signal.

13. The amplifier circuit of claim 10 wherein said differential amplifier is characterized as being an operational transconductance amplifier (OTA).

14. The amplifier circuit of claim 10 further comprising:
   a third capacitor having a first terminal coupled to said first signal line, and a second terminal coupled to said common-mode feedback signal line; and
   a fourth capacitor having a first terminal coupled to said common mode feedback terminal signal line, and a second terminal coupled to said second signal line.

15. An amplifier circuit with a charge-balanced switched-capacitor circuit, comprising:
   an amplifier having positive and negative input terminals for receiving a differential input voltage, and positive and negative output terminals for providing a differential output voltage;
   first and second capacitors each having first and second terminals;
   equalization means for coupling said first terminal of said first capacitor to said first terminal of said second capacitor, and said second terminal of said first capacitor to said second terminal of said second capacitor, during an equalization phase;
   sampling means for coupling a first input voltage to said first terminal of said first capacitor, a second input voltage to said second terminal of said second capacitor, and said second terminal of said first capacitor to said first terminal of said second capacitor, during a sample phase; and
   transfer means for coupling at least one terminal of said first and second capacitors to said amplifier, during a transfer phase.

16. The amplifier circuit of claim 15 wherein said equalization means comprises:
   a first switching element having a first terminal coupled to said first terminal of said first capacitor, and a second terminal coupled to said first terminal of said second capacitor (73), said first switching element active during said equalization phase; and
   a second switching element having a first terminal coupled to said second terminal of said first capacitor, and a second terminal coupled to said second terminal of said second capacitor, said second switching element active during said equalization phase.

17. The amplifier circuit of claim 15 wherein said sampling means comprises:
   a third switching element having a first terminal for receiving said first input voltage, and a second terminal coupled to said first terminal of said first capacitor, said third switching element active during said sample phase;
   a fourth switching element having a first terminal coupled to said second terminal of said second capacitor, and a second terminal for receiving said second input voltage, said fourth switching element active during said sample phase; and
   a fifth switching element having a first terminal coupled to said second terminal of said first capacitor, and a second terminal coupled to said first terminal of said second capacitor, said fifth switching element active during said sample phase.

18. The amplifier circuit of claim 15 wherein said transfer means couples said second terminal of said first capacitor to one of said positive and negative input terminals of said amplifier, and said first terminal of said second capacitor to another of said positive and negative input terminals of said amplifier, during said transfer phase.

19. The amplifier circuit of claim 18 wherein said transfer means further couples said first terminal of said first capacitor to one of said positive and negative output terminals of said amplifier, and couples said second terminal of said second capacitor to another of said positive and negative output terminals of said amplifier, during said transfer phase.

20. The amplifier circuit of claim 15 wherein said first input voltage is characterized as being a signal voltage, and wherein said second input voltage is characterized as being a reference voltage.

* * * * *